United States Patent [19]

Ichimura

[11] Patent Number: 4,498,720
[45] Date of Patent: Feb. 12, 1985

[54] FLAT PACK WITH HOUSING DEFORMATION PREVENTION MEANS

[75] Inventor: Yoshiaki Ichimura, Tokyo, Japan

[73] Assignee: Japan Aviation Electronics Industry Limited, Tokyo, Japan

[21] Appl. No.: 496,847

[22] Filed: May 23, 1983

[30] Foreign Application Priority Data

May 26, 1982 [JP] Japan .................................. 57-87897
May 26, 1982 [JP] Japan .................................. 57-87898

[51] Int. Cl.³ ............................................. H01R 9/09
[52] U.S. Cl. ............................ 339/75 MP; 339/17 CF
[58] Field of Search .......... 339/17 CF, 75 M, 75 MP, 339/176 M, 176 MP

[56] References Cited

U.S. PATENT DOCUMENTS

| | | | |
|---|---|---|---|
| 3,311,790 | 3/1967 | Vizzier, Sr. et al. | 339/17 CF |
| 3,951,491 | 4/1976 | Mysiak | 339/17 CF |
| 4,164,007 | 8/1979 | Cutchaw | 339/17 CF |
| 4,341,433 | 7/1982 | Cherian | 339/176 MP |
| 4,376,560 | 3/1983 | Olsson et al. | 339/17 CF |
| 4,427,249 | 1/1984 | Bright et al. | 339/17 CF |

FOREIGN PATENT DOCUMENTS 153295  3/1979 Japan .............................. 339/17 CF Primary Examiner—John McQuade
Attorney, Agent, or Firm—Laff, Whitesel, Conte & Saret

[57] ABSTRACT

An electrical connector for leadless integrated circuit packages which has clamps for depressing and keeping the package in a connector housing to establish pressure contact of terminal pads of the package with contact elements of the connector. A lower portion of the clamp engages with a bottom surface of the connector housing in the vicinity of an imaginary line on which the bottom surface of the connector housing intersects with a line of pressure force acting onto the connector housing from each contact element, so that the connector housing is substantially freed from deformation caused by a torque due to contact pressure and clamping force.

11 Claims, 9 Drawing Figures

FLAT PACK WITH HOUSING DEFORMATION PREVENTION MEANS

BACKGROUND OF THE INVENTION

This invention relates to electrical connectors, and in particular, to improvements in or relating to connectors for leadless circuit boards such as leadless integrated circuit packages, leadless large-scaled circuit packages, and leadless printed circuit boards.

In order to removably mount the leadless circuit boards (which will be referred to as "daughter board") employing terminal pads in place of leads onto another circuit board (which will be referred to as "mother board"), connectors have been used in the prior art as disclosed in U.S. Pat. Nos. 3,904,262, 4,063,791, and 4,204,722. Generally speaking, such a connector includes a housing of insulator material for receiving the daughter board therein. A plurality of contact elements are mounted in the housing to engage terminal pads of the received daughter board and to connect with conductor elements of the mother board on which the connector is mounted. Clamping means are used for clamping the daughter board and the connector housing to press the terminal pads of daughter board onto the contact elements.

In conventional connectors of such a type, the clamping means has an upper portion engaging the upper surface of the daughter board and a lower portion engaging a side end or a bottom edge of the connector housing. Therefore, when the daughter board and the connector housing are clamped by the clamping means, an upwardly acting force is applied on the peripheral portion of the connector housing. On the other hand, since each pad is pressed onto a corresponding contact element, a pressure is applied on the contact element. Therefore, another force is applied downwardly through the connector housing and onto the contact element. These upward and downward forces make a moment or a torque because each contact element is generally located apart from the peripheral edge of the connector housing. Therefore, the connector housing is disadvantageously deformed so that the peripheral portion of the connector housing is raised. As a result, the intended contact force cannot be obtained between the pads and the contact elements.

SUMMARY OF THE INVENTION

Accordingly, it is a principal object of this invention to provide an electrical connector for leadless circuit board wherein there is a prevention of a deformation of the connector housing which might otherwise occur due to a force for clamping the circuit board and the connector housing. The deformation leads to a reduction of contact pressure; or the pressure might even be substantially cancelled.

It is another object of this invention to provide an electrical connector for leadless circuit board wherein the circuit board is readily loadable and unloadable in the housing as well as the above-described object is realized.

It is still another object of this invention to provide an electrical connector for leadless circuit board which is simple in structure and assembling.

According to this invention, an electrical connector is obtained for mounting a first electric circuit board having terminal pads onto a second electric circuit board having conductor elements and for electrically connecting the terminal pads with the conductor elements. The connector includes an insulator housing having a top surface for receiving the first electric circuit board and a bottom surface to be opposite to the second electric circuit board, and a plurality of contact elements each having a spring contact portion at one end thereof and a terminal pin portion at the other end thereof.

The contact elements are mounted in, and arranged along a peripheral edge of the insulator housing so that the spring contact portions extend to engage respective terminal pads of the first circuit board received on the insulator housing while the terminal pin portions protruding from the bottom surface of the insulator housing provide for electrically connecting with the conductor elements of the second electric circuit board. The connector includes clamping means for clamping the insulator housing and the first electric circuit board received thereon to press the terminal pads onto the spring contact portions. The pressure applied to each spring contact portion acts onto, and is supported by, the insulator housing through each contact element.

The clamping means comprises upper means to engage with, and depress, the upper surface of the first electric circuit board received on the housing, lower means to engage the bottom surface of the insulator housing, and connecting means connecting the upper means and the lower means. The lower means engage the bottom surface of the housing in the vicinity of an imaginary line on which the bottom surface of the insulator housing intersects a line of action of the pressure acting onto the insulator housing from each contact element. Thus, the invention cancels a torque which would otherwise by likely due to the pressure acting onto the insulator housing through each contact element and to a clamping force acting onto the insulator housing from the lower means of the clamping means.

In an aspect of this invention, the contact elements are arranged in a plurality of rows along the peripheral edge of said insulator housing. The lower means of the clamping means engage the bottom surface of the insulator housing along lines which are on or are inside the perimeter of an imaginary perimeter line at which the bottom surface of the insulator housing intersects a line of action of the pressure acting onto the insulator housing from each contact element in the outermost contact-element row. Advantageously, the lower means of the clamping means engage the bottom surface of the housing on a center line of a plurality of imaginary lines on each of which the bottom surface of the housing intersects with a line of action of the pressure acting onto the insulator housing from each contact element in each contact-element row.

Further objects, features and other aspects of this invention will be understood from the following detailed description of preferred embodiments referring to the accompanying drawings.

DETAILED DESCRIPTION OF PREFERRED EMBODIMENTS

Figure 1:
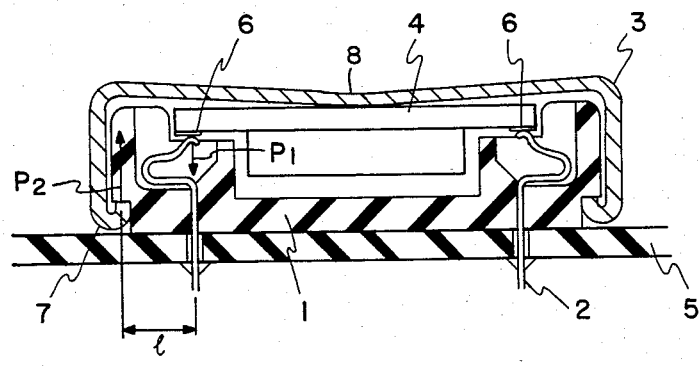
FIG. 1 is a sectional view of an electrical connector for a leadless circuit board known in the prior art.

Referring to FIG. 1, a known connector includes a connector housing 1, a plurality of contact elements 2 mounted in connector housing 1, and clamping means 3 for depressing and holding a leadless integrated circuit package or a daughter board 4 into connector housing 1, as disclosed in, for example, U.S. Pat. Nos. 3,904,262, 4,063,791, 4,204,722, 4,340,266 and others.

The connector is mounted on another circuit board or a mother board 5, and contact elements 2 are connected to conductors (not shown) on mother board 5. Daughter board 4 is held in the connector housing 1 by clamping means 3. Terminal pads 6 are pressed onto, and in contact with, contact portions of contact elements 2. Thus, daughter board 4 is electrically connected with mother board 5.

In order to depress daughter board 4 into connector housing 1, clamping means 3 has hook portions 7 engaging peripheral edges of connector housing 1. Upper portion 8 of clamping means 3 engages with the upper surface of daughter board 4. A pressing force acts on each contact element 2 and also acts downwardly on connector housing 1 through contact element 2, as shown by an arrow $P_1$. On the other hand, a certain force $P_2$ acts upwardly on peripheral edges of connector housing 1 through hook portions 7 by a reaction of pressure contact of daughter board 4 and contact elements 2. Since these forces $P_1$ and $P_2$ apply on different points of the connector housing spaced by a distance l from one another and since they are acting in opposite directions, a torque or a moment generates. Therefore, the peripheral portion of connector housing 1 is deformed or bent upwardly. This means that a sufficient or intended contact pressure cannot be insured between terminal pads 6 and contact elements 2.

This invention provides an arrangement of clamping structure wherein the connector housing is substantially freed from deformation due to contact pressure.

Referring to FIGS. 2-5, a connector shown therein includes a rectangular connector housing 11 which is made of an insulator material such as polycarbonate, polypropylene, polyphenylene sulfite, polybutylene terephthalate and the like. Connector housing 11 is formed with a rectangular opening 111 in the center portion of its top surface for receiving daughter board 4.

Daughter board 4 is in a rectangular form and has a plurality of terminal pads 6 arranged in a row along each peripheral edge thereof.

Contact elements 12 are mounted in a bottom portion of central opening 111 and are arranged in a row along each peripheral edge of connector housing 11 to correspond to the terminal pads of daughter board 4. Contact element 12 has a spring contact portion 13 extending into opening 111 and a terminal pin portion 14 protruding from a bottom surface 112 of connector housing 11. Spring contact portion 13 is in contact with a corresponding terminal pad 6 of daughter board 4 and terminal pin portion 14 is connected to a corresponding conductor (not shown) of mother board 5 by solder means 15.

The arrangement of connector housing 11 and contact elements 12 is generally similar to that of known connectors.

The connector further includes a rectangular cover plate or frame 16 of, for example, stainless steel, and a ring-like sliding plate 17 slidably mounted on cover plate 16. Cover plate 16 of, for example, stainless steel is provided with a plurality of claws 18 on its upper surface and the peripheral edge of ring-like sliding plate 17 is engaged with claws 18 so that sliding plate 17 is slidable rotatively on cover plate 16. The peripheral edge of ring-like sliding plate 17 is partially cut away at four equiangularly-spaced positions as shown at 19 in FIG. 2. Accordingly, sliding plate 17 has four equiangularly-spaced radial fins 20. Therefore, sliding plate 17 can be disassembled, or removed, from cover plate 16 by rotating sliding plate 17 to register the cut-away portions 19 with claws 18. In order to use a certain rotating tool for sliding plate 17, four openings 21 are formed in the surface of sliding plate 17 for receiving tip ends of the tool.

Four hook plates 22 are mounted on respective side ends of rectangular connector housing 11. Each hook plate 22 is made of, for example, stainless steel, beryllium-copper alloy or the like and is formed in an L-shaped form. A tab 23 is formed on the top end of hook plate 22 to engage radial fins 20 of sliding plate 17. Hook plate 22 is secured onto a side surface of rectangular connector housing 11 by pin means 24 which are received in longitudinal slits 25 formed in hook plate 22 so that hook plate 22 is movable in a vertical direction.

A lower flange portion 26 of L-shaped hook plate 22 extends under bottom surface 112 of connector housing 11 and has an engaging portion 27 at its extended end which engages bottom surface 112 of connector housing 11.

In the arrangement, daughter board 4 is put into rectangular opening 111 of connector housing 11, and cover plate 16 with sliding plate 17 mounted thereon overlies daughter board 4. Thereafter, sliding plate 17 is rotated by use of a rotating tool so that engagement of radial fins 20 with tabs 23 is established.

Figure 2:
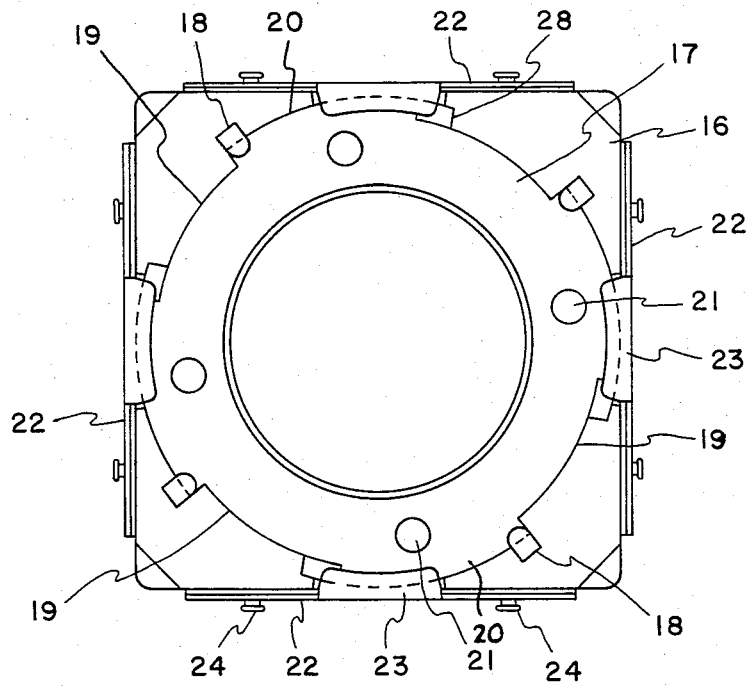
FIG. 2 is a plan view of an embodiment of this invention.
Figure 3:
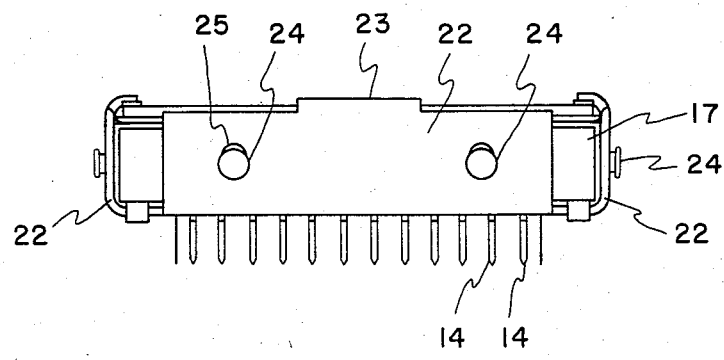
FIG. 3 is a side view of the embodiment.
Figure 4:
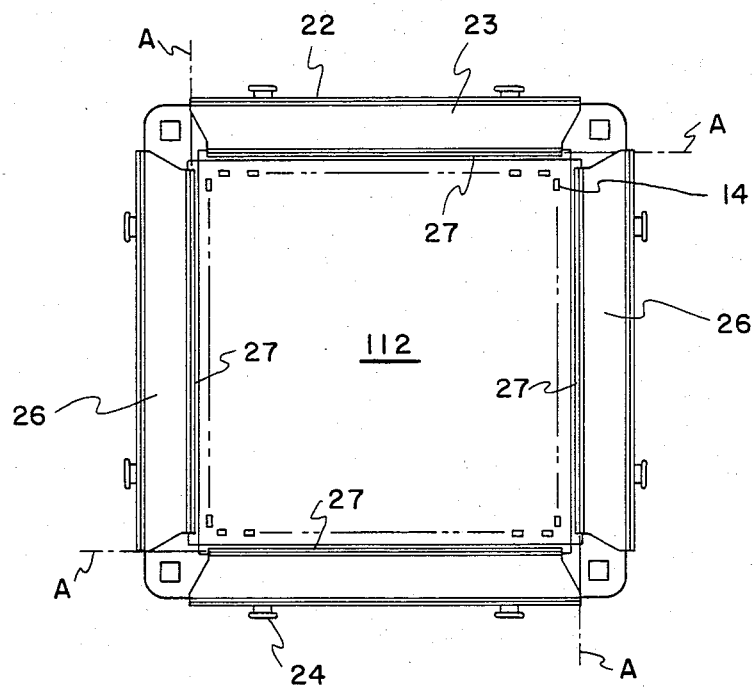
FIG. 4 is a bottom view of the embodiment.

In this connection, a side portion of radial fin 20 is tapered as shown at 28 in FIG. 2 so that radial fin 20 can be moved under the corresponding tab 23. Accordingly, daughter board 4 is depressed together with cover plate 16 by engagement of radial fins 20 and tabs 23. At that time, hook plate 22 is slightly raised so that engaging portion 27 comes into elastic contact with bottom surface 112 of connector housing 11. Thus, daughter board 4 is kept in the depressed condition and terminal pads 6 of daughter board 4 and spring contact portions 13 of contact elements 12 are in contact with one another. In order to obtain a desired contact pressure, dimensions of hook plates and sliding plates should be designed carefully.

As clearly understood from the above description, cover plate 16, sliding plate 17 and hook plates 22 serve as clamping means for depressing and keeping daughter board 4 in connector housing 11.

Figure 5:
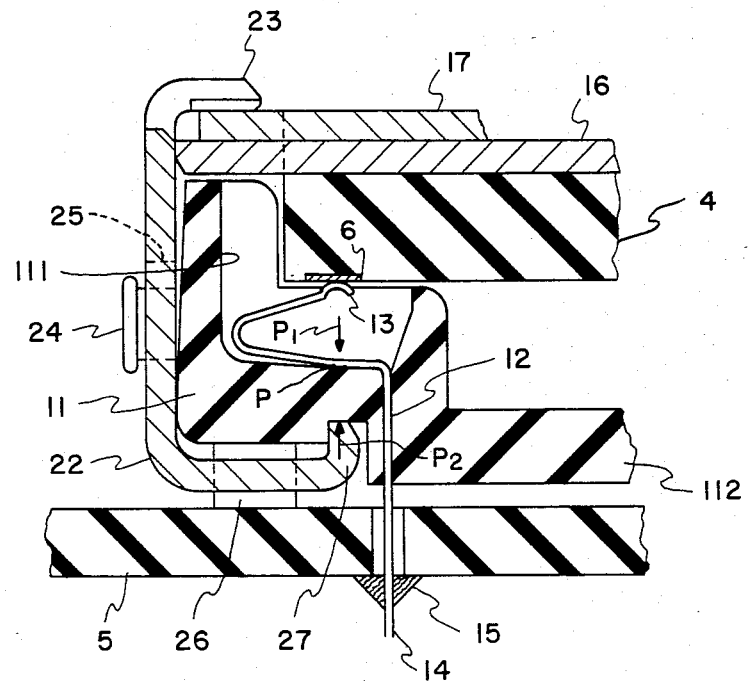
FIG. 5 is a sectional view of a main portion of the embodiment.

Referring to FIG. 5, in the depressed condition of daughter board 4, contact element 12 is pressed by daughter board 4. The pressure $P_1$ acts on connector housing 11 supporting contact elements 12 at a point at which the contact element is pressed into a pressure-contact with the connector housing. In the embodiment shown, contact element 12 is in pressure-contact with connector housing 11 at an intermediate point P between spring contact portion 13 and a portion of contact element 12 supported by connector housing 11. Engaging portion 27 is disposed to engage the bottom surface 112 of connector housing 11 at a point directly below the point P. Therefore, an upward force $P_2$ is applied to connector housing 11 from engaging portion 27 and a downward pressure force $P_1$ is applied to connector housing 11 from contact element 12. The two forces $P_1$, $P_2$ are on a same line of action so that no torque or moment is generated. Accordingly, connector housing 11 is not deformed.

Since a plurality of contact elements 12 are arranged in a row along a side edge of connector housing 11, engaging portion 27 is formed to extend along the side edge of and be in contact with the bottom surface at an imaginary line (as shown at A in FIG. 4) on which bottom surface 112 of connector housing 11 intersects with lines of action of pressure forces $P_1$ applied on connector housing 11 from respective contact elements 12.

It is not necessary for engaging portion 27 to be strictly positioned on the line A, but it is enough if engaging portion 27 is in the vicinity of the line A so that lines of pressure forces $P_1$ and $P_2$ are close enough not to generate a substantial torque.

There have been known circuit boards wherein terminal pads are arranged in a plurality of rows along a side edge thereof. In order to mount such circuit boards on mother boards, connectors must have contact elements arranged in a plurality of rows along a side edge of the connector housing.

Figure 6:
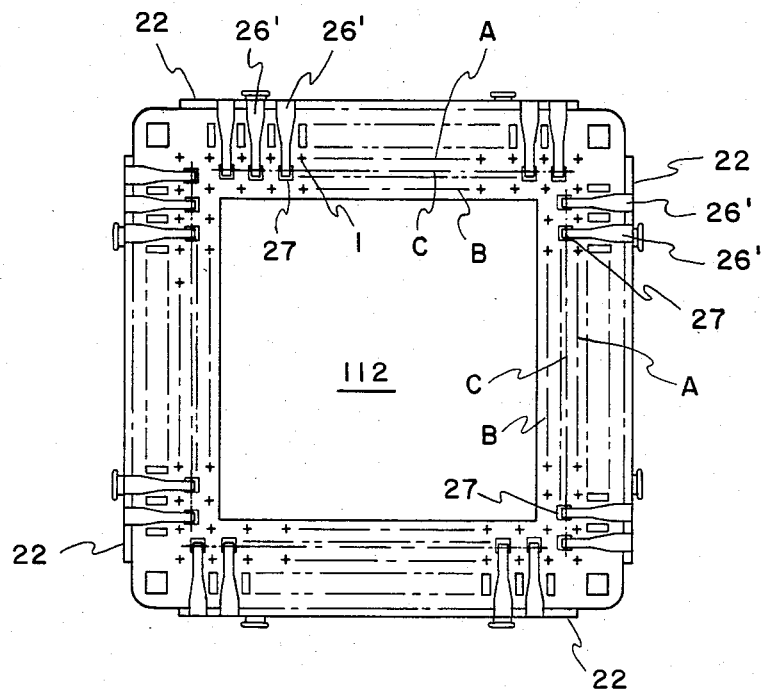
FIG. 6 is a bottom view of another embodiment.
Figure 7:
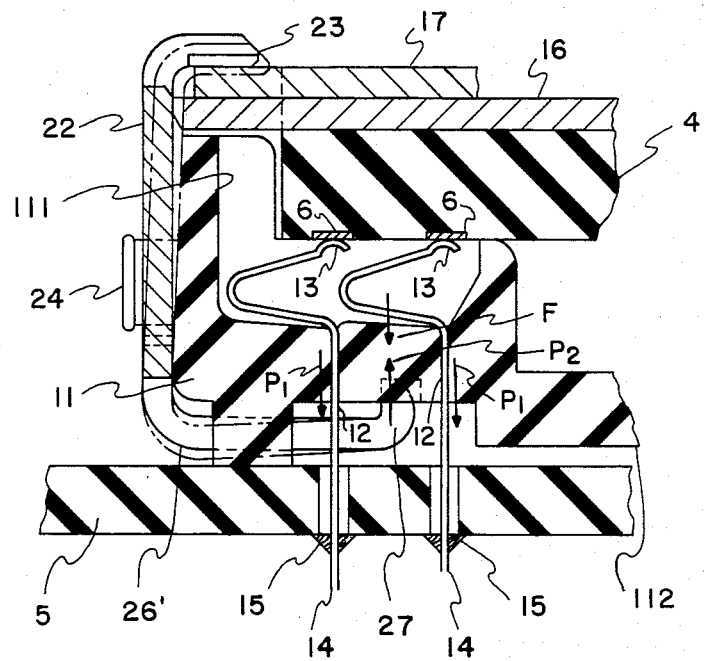
FIG. 7 is a sectional view of a main portion of the another embodiment.

Referring to FIGS. 6 and 7, another embodiment shown therein is usable for mounting such a circuit board having terminal pads arranged in two rows along a side surface of the circuit board. The connector is generally similar to the connector as described in connection with FIGS. 2–5 except for several arrangements and similar parts are represented by the same reference characters.

In the connector, contact elements 12 are arranged in two rows along each side edge of rectangular connector housing 11 to correspond to two rows of terminal-pads on daughter board 4. A lower flange portion of L-shaped hook plate 22 is formed in a comb-like form or a pectinated form to have a plurality of teeth 26' extending under bottom surface 112 of connector housing 11 and between adjacent terminal pin portions 14 of connector elements 12 arranged in the outermost contact-element row. An engaging portion 27 is formed at the extended end of each tooth 26' and engages bottom surface 112 of connector housing 11 at a time when the daughter board 4 is clamped in the same manner as described in connection with the embodiment in FIGS. 2–5.

Considering a contact element in the outermost contact-element row and an adjacent contact element in the inner contact-element row, pressure forces $P_1$ and $P_1$ are applied to connector housing 11 from the adjacent outer and inner contact elements 12 as shown in FIG. 7. A resultant force F of the two pressure forces $P_1$ and $P_1$ acts on connector housing 11 at a point between the adjacent outer and inner contact elements. Engaging portion 27 is disposed to engage bottom surface 112 of connector housing 11 on a line of action of the resultant force F. In the arrangement, since an upward force $P_2$ is applied to connector housing 11 from engaging portion 27 which is opposite to the resultant force F but in the same line of action, there is no torque or moment to deform connector housing 11.

All engaging portions 26' on respective teeth 27 are positioned to engage with bottom surface 112 of connector housing 11 at intermediate points between respective pairs of adjacent outer and inner contact elements.

In other words, engaging portions 27 are positioned to engage with bottom surface 112 of connector housing 11 on a center line C between an imaginary line A and another imaginary line B. In this connection, the imaginary line A is a line on which lines of action of pressure forces $P_1$ applied to connector housing 11 from respective contact elements 12 in the outer contact-element row intersect with bottom surface 112 of connector housing 11. The other imaginary line B is a line on which lines of action of pressure forces $P_1$ applied to connector housing 11 from respective contact elements 12 in the inner contact-element row intersect with bottom surface 112 of connector housing 11.

In practical use, engaging portions 27 are not required to be strictly positioned on the line C but may be positioned inner than the imaginary line A to substantially cancel such a moment as deforming connector housing, because a distance between outer and inner contact-element rows is very small.

Figure 8:
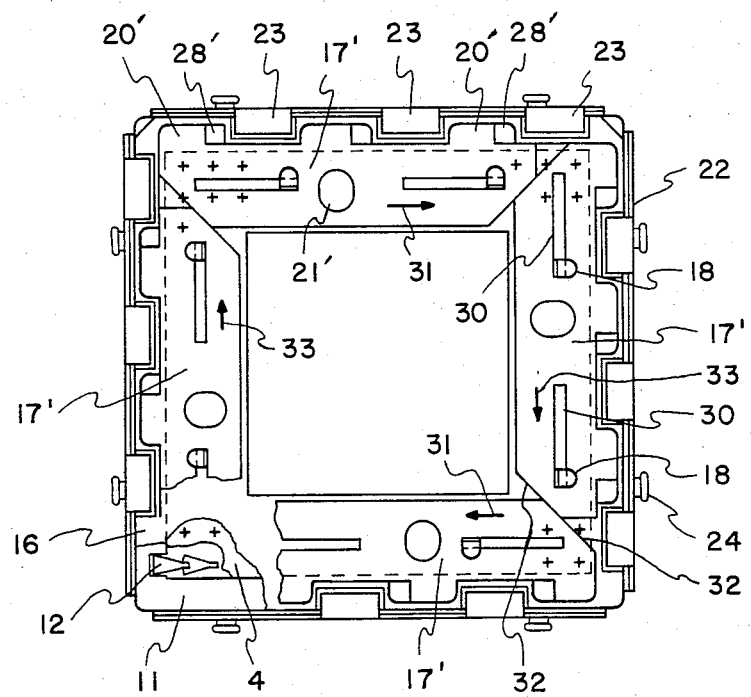
FIG. 8 is a partially exploded plan view of still another embodiment.

Referring to FIG. 8, another embodiment shown therein has four sliding plates 17'. Each sliding plate 17' is secured onto cover plate 16 by claws 18. However, claws 18 stand up on cover plate 16 through slits 30 formed in sliding plate 17' so that sliding plate 17' can move along a side edge of connector housing 11. Sliding plate 17' is provided with fins 20' extending outwardly from spaced position of its outer side edge. Fins 20' engage tabs 23 of hook plate 22 at a time when sliding plate 17' is moved from a position shown in FIG. 8 in a direction of an arrow 31, so that cover plate 16 and daughter board 4 are depressed. Each fin 20' is provided with a tapered region 28' at one end to insure that fin 20' gets under tab 23.

In the arrangement as shown in FIG. 8, since four sliding plates 17' are in contact with one another at respective ends to form a rectangular frame, each sliding plate 17' cannot be moved independently. However, since they are in contact with one another at their tapered ends as shown at 32 in FIG. 8, four sliding plates 17' can be moved at a time by use of a certain rotating tool. To this end, each sliding plate 17' is provided with a hole 21' for receiving a tip end of such a tool.

Figure 9:
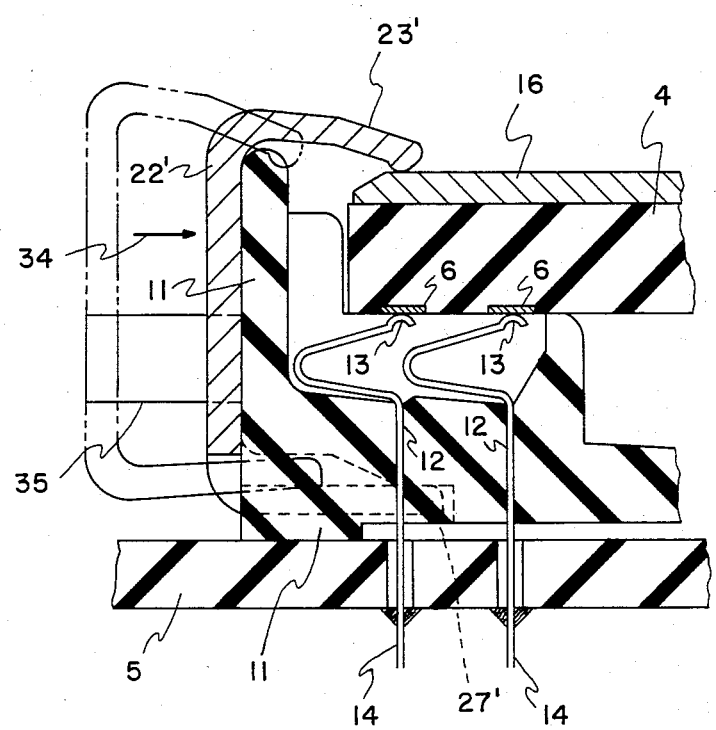
FIG. 9 is a sectional view of a main portion of a further embodiment.

Referring to FIG. 9, in a further embodiment shown therein, hook plates 22' are made of elastic materials such as beryllium-copper alloy, and are removably attached to respective side portions of rectangular connector housing 11. When hook plate 22' is forced in a direction of an arrow 34 to fit on a corresponding side end portion of connector housing 11, daughter board 4 is depressed together with cover plate 16 by elasticity of hook plate 22'. Thus, daughter board 4, cover plate 16 and connector housing 11 is clamped by tab 23' and engaging portions 27'.

A guide post or guide posts 35 may be mounted on each side surface of connector housing 11 for piloting hook plate 22 to be attached onto the side portion of connector housing 11.

As will be clearly understood by those skilled in the art, this invention can also be applied to connectors for mounting daughter boards having terminal pads arranged in three or more rows along one edge of the daughter board.

What is claimed is:

1. In an electrical connector for mounting a first electric circuit board having terminal pads onto a second electric circuit board having conductor elements and electrically connecting the terminal pads with the conductor elements, said terminal pads being arranged along a peripheral edge of the first electric circuit board, said connector including an insulator housing having a top surface for receiving said first electric circuit board and a bottom surface to be opposite to said second electric circuit board, a plurality of contact elements each having a spring contact portion at one end thereof and a terminal pin portion at the other end thereof, said contact elements being mounted in, and arranged along a peripheral edge of, said insulator housing so that said spring contact portions extend to engage with respective terminal pads of the first circuit board received on said insulator housing while said terminal pin portions protruding from the bottom surface of said insulator housing to electrically connect with said conductor elements of said second electric circuit board, and clamping means for clamping said insulator housing and said first electric circuit board received thereon to press said terminal pads onto said spring contact portions, the pressure applied to each spring contact portion acting onto, and being supported by, said insulator housing through each contact element, the improvement which comprises said clamping means including upper means to engage with, and depress, the upper surface of said first electric circuit board received on said housing, lower means to engage with the bottom surface of said insulator housing, and connecting means connecting said upper means and said lower means, said lower means engaging with the bottom surface of said housing in the vicinity of an imaginary line on which the bottom surface of said insulator housing intersects with a line of action of the pressure acting onto said insulator housing from each contact element so that a torque due to the pressure acting onto said insulator housing through each contact element and a clamping force acting onto said insulator housing from said lower means of said clamping means may be substantially cancelled.

2. The electrical connector as claimed in claim 1, wherein said terminal pads are arranged in a plurality of rows along the peripheral edge of said first circuit board, said contact elements being arranged in a plurality of rows along the peripheral edge of said insulator housing to correspond to said terminal pads of a plurality of rows, said lower means of said clamping means engaging the bottom surface of said insulator housing along lines which are no closer to outside edges of said housing than an imaginary perimeter line on which the bottom surface of said insulator housing intersects with a line of action of the pressure acting onto said insulator housing from each contact element in the outermost contact-element row.

3. The electrical connector as claimed in claim 2, wherein said lower means of said clamping means engage with the bottom surface of said housing on a center line of a plurality of imaginary lines on each of which the bottom surface of said insulator housing intersects with a line of action of the pressure acting onto said insulator housing from each contact element in each contact-element row.

4. In an electrical connector for mounting a first rectangular electric circuit board having terminal pads onto a second electric circuit board having conductor elements and electrically connecting the terminal pads with the conductor elements, said terminal pads being arranged along peripheral edges of the first electric circuit board, said connector including a rectangular insulator housing having an opening at a central portion in its top surface to receive said first electric circuit board therein, a plurality of contact elements each having a spring contact portion at one end thereof and a terminal pin portion at the other end thereof, said contact elements being mounted in, and arranged along peripheral edges of, said insulator housing so that said spring contact portions extend into said opening to engage with respective terminal pads of said first circuit board received on said opening while said terminal pin portions protruding from a bottom surface of said insulator housing to electrically connect with said conductor elements of said second electric circuit board, and clamping means for clamping said insulator housing and said first electric circuit board received in said opening to press said terminal pads onto said spring contact portions, the pressure applied to each spring contact portion acting onto, and being supported by, said insulator housing through each contact element, the improvement which comprises said clamping means including an upper means for engaging with the upper surface of said first electric circuit board received in said opening and for depressing said first electric circuit board, lower means extending along each side edge of said rectangular housing and engaging with the bottom surface of said housing, and connecting means connecting said upper means and said lower means, said lower means engaging with the bottom surface of said housing in the vicinity of an imaginary line on which the bottom surface of said housing intersects with a line of action of the pressure acting onto said housing from each contact element arranged along the side edge of said housing so that a torque due to the pressure acting onto said housing through each contact element and a clamping force acting onto said housing from said lower means of said clamping means may be substantially cancelled.

5. The electrical connector as claimed in claim 4, wherein said terminal pads are arranged in a plurality of rows along each one of four peripheral side edges of said first rectangular circuit board, said contact elements being arranged in a plurality of rows along each one of four side edges of said rectangular insulator housing to correspond to said terminal pads, said lower means engaging with the bottom surface of said insulator housing at a region inner than an imaginary line on which the bottom surface of said housing intersects with a line of action of the pressure acting onto said housing from each contact element in the outermost contact-element row arranging along the corresponding side edge of said housing.

6. The electrical connector as claimed in claim 5, wherein said lower means engages with the bottom surface of said housing on a center line of a plurality of imaginary lines on each of which the bottom surface of said housing intersects with a line of action of the pressure acting onto said insulator housing from each contact element in each one of contact-element rows arranged along the corresponding side edge of said housing.

7. The electrical connector as claimed in claim 4, wherein said upper means of said clamping means comprises a cover plate to be put on the upper surface of said first electric circuit board received in said opening of said housing and sliding plate means slidably mounted on said cover plate and having cam means, and said connecting means of said clamping means comprises a lower connecting portion joined to said lower means and upper engaging means being engageable with said cam means of said sliding plate means at a time when said sliding plate means is slid in a predetermined direction to depress the first electric circuit board together with said cover plate.

8. The electrical connector as claimed in claim 4, wherein said connecting means includes four hook plate members each having a generally "L"-shaped vertical section and extending along each side surface of said rectangular housing, said lower means being connected to an end of the foot portion of the "L".

9. The electrical connector as claimed in claim 5, wherein said connecting means includes four hook plate members each having a generally "L"-shaped vertical section and extending along each side surface of said rectangular housing, a foot portion of said "L" being formed in a pectinated form, and said lower means being connected to ends of teeth of said pectination.

10. The electrical connector as claimed in claim 8 or 9, wherein said upper means of said clamping means comprises a cover plate to be put on the upper surface of said first electric circuit board received in said opening of said housing and sliding plate means slidably mounted on said cover plate and having cam means, each of said "L"-shaped hook plate members having a tab means formed on the top end thereof to engageable with said cam means of said sliding plate means at a time when said sliding plate means is slid in a predetermined direction to depress the first electric circuit board together with said cover plate, and each one of said hook plate members being joined to the corresponding side surface of said housing but movable upwardly along the side surface.

11. The electrical connector as claimed in claim 8 or 9, wherein said hook plate member is made of elastic metal material.

* * * * *